(12) United States Patent
Seo

(10) Patent No.: US 6,333,518 B1
(45) Date of Patent: *Dec. 25, 2001

(54) THIN-FILM TRANSISTOR AND METHOD OF MAKING SAME

(75) Inventor: Hyun-Sik Seo, Kyungki-do (KR)

(73) Assignee: LG Electronics Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,462

(22) Filed: Aug. 26, 1997

(30) Foreign Application Priority Data

Aug. 26, 1997 (KR) .................................................. 97-40896

(51) Int. Cl.[7] .......................... H01L 29/786; H01L 29/45
(52) U.S. Cl. .............................. 257/72; 257/59; 257/763; 257/770; 257/764
(58) Field of Search ................................ 257/72, 59, 763, 257/764, 770

(56) References Cited

U.S. PATENT DOCUMENTS

| 4,220,706 | 9/1980 | Spak . |
| 4,980,752 | * 12/1990 | Jones .................... 257/763 |
| 5,036,370 | 7/1991 | Miyago et al. . |

FOREIGN PATENT DOCUMENTS

| 0 301 571 | 2/1989 | (EP) . |
| 0301571 | 2/1989 | (EP) . |
| 301571 | 2/1989 | (EP) . |
| 0 602 315 | 6/1994 | (EP) . |
| 0602315 | 6/1994 | (EP) . |
| 0 812 012 | 12/1997 | (EP) . |
| 2253742 | 9/1992 | (GB) . |
| 2254187 | 9/1992 | (GB) . |
| 2 307 597 | 5/1997 | (GB) . |
| 2307597 | 5/1997 | (GB) . |

(List continued on next page.)

OTHER PUBLICATIONS

Patent Abstracts of Japan, vol. 9, No. 315 [E–365] and Japan 60–149173 (Hitachi).
Patent Abstracts of Japan, vol. 5, No. 197 [E–86] and Japan 56–118370 (Cho Lsi Gijutsu).
"IBM Technical Disclosure Bulletin" vol. 35, No. 3, Aug. 1992, pp. 205–206.
"Wet Etchant for Molybdenum Having High Selectivity Against Aluminum" IBM Technical Disclosure Bulletin, vol. 35, No. 3, Aug. 1, 1992, pp. 205–206, XP 000326238.
"Low Cost, High Display Quality TFT–LCD Process", Society for Information Display, EuroDisplay 96, Proceedings of the 16th International Display Research Conference, Oct. 1, 1996, 591–594.
"Hillock–Free Al–Gate Materials Using Stress–Absorbing Buffer Layer for Large Area AMLCDs" Society for Information Display 96 Digest, pp. 341–344, 1996.

*Primary Examiner*—Jerome Jackson, Jr.

(57) ABSTRACT

A thin-film transistor includes a substrate and a gate including a double-layered structure having first metal layer formed of a material exhibiting tensile stress and second metal layer formed of a metal exhibiting compressive stress, the first metal layer being wider than the second metal layer by about 1 to 4 $\mu$m. A method of making such a thin film transistor includes the steps of: depositing a first metal layer comprising a material exhibiting tensile stress on a substrate, depositing a second metal layer exhibiting compressive stress on the first metal layer; patterning the second metal layer and the first metal layer such that the first metal layer is wider than the second metal layer.

31 Claims, 9 Drawing Sheets

FOREIGN PATENT DOCUMENTS

| | | |
|---|---|---|
| 61-44468 | 3/1986 | (JP) . |
| 01120068 | 5/1989 | (JP) . |
| 1-222448 | 9/1989 | (JP) . |
| 03114028 | 5/1991 | (JP) . |
| 04097531 | 3/1992 | (JP) . |
| 4-188770 | 7/1992 | (JP) . |
| 05315615 | 11/1993 | (JP) . |
| 5-315615 | 11/1993 | (JP) . |
| 05343683 | 12/1993 | (JP) . |
| 5-343683 | 12/1993 | (JP) . |
| 6-373314 | 2/1994 | (JP) . |
| 06104241 | 4/1994 | (JP) . |
| 6-104241 | 4/1994 | (JP) . |
| 07-077695 | 3/1995 | (JP) . |
| 07297185 | 11/1995 | (JP) . |
| 08254680 | 10/1996 | (JP) . |
| 8-254680 | 10/1996 | (JP) . |
| 08297299 | 11/1996 | (JP) . |
| 1995-4593 | 2/1995 | (KR) . |
| WO 92/06497 | 4/1992 | (WO) . |
| WO 92/06504 | 4/1992 | (WO) . |

\* cited by examiner

THIN-FILM TRANSISTOR AND METHOD OF MAKING SAME

BACKGROUND OF THE INVENTION

1. Field of the Invention

The present invention relates to a thin-film transistor of a liquid crystal display and, more particularly, to a thin-film transistor having a gate including a double-layered metal structure and a method of making such a double-layered metal gate.

2. Discussion of Related Art

An LCD (Liquid Crystal Display) includes a switching device as a driving element, and a pixel-arranged matrix structure having transparent or light-reflecting pixel electrodes as its basic units. The switching device is a thin-film transistor having gate, source and drain regions.

The gate of the thin-film transistor is sometimes made of aluminum to reduce its wiring resistance, but an aluminum gate may cause defects such as hillock.

One alternative to using pure aluminum to form a gate, is to use an aluminum alloy to prevent the hillock problem. However, the use of an aluminum alloy such as AlTa in which diffusion of Aluminum atoms is prevented by adding a small amount of a refractory metal such as Ta, causes the gate to be electrically and chemically unstable.

Another alternative is to form a double-layered metal gate, i.e., molybdenum-coated aluminum gate, to overcome the problem of the hillock.

One such prior art double-layered metal gate is shown in FIGS. 1 and 2A–2F. FIG. 1 is a top plan view of a prior art thin-film transistor and FIGS. 2A–2F are cross-sectional views of FIG. 1 along line X—X.

To fabricate a double-layered gate, metals such as aluminum and molybdenum are sequentially deposited, followed by a patterning process carried out via photolithography to form resulting metal films which have the same width. Although the double-layered gate is desirable to overcome the problem of hillock, the resulting deposited metal films forming the double-layered gate are so thick that a severe single step is created by a thickness difference between the metal films and a substrate, thereby causing a single step difference between the substrate and the double-layered gate which deteriorates the step coverage of a later formed gate oxide layer. The source and drain regions formed on the gate oxide layer may have disconnections between areas of the source and drain regions which are overlapped and non-overlapped with the gate, or electrically exhibit short circuits as a result of contact with the gate.

In such a method of forming the gate, each of the metal layers of Al and Mo form a clad structure as seen in FIGS. 2A–2F.

FIGS. 2A through 2F are diagrams illustrating the process for fabricating a thin-film transistor of FIG. 1. Referring to FIG. 2A, aluminum is deposited on a substrate 11 to form a first metal layer 13. Then a second metal layer 15 is formed so as to completely cover the first metal layer 13 to define a clad structure seen in FIG. 2B. The second metal layer 15 is formed by depositing Mo so as to completely cover the first metal layer 13.

Thus, the first and second metal layers 13 and 15 form a gate having a double-layered metal structure in a clad arrangement. The clad structure defines a single step difference between the gate structure and the substrate 11.

A gate insulating film 17 is then formed over the gate electrode clad structure formed by the first and second metal layers 13, 15. A semiconductor layer 19 is then formed by deposition and etching on the gate electrode insulating film 17. Then a contact layer 21 is formed by deposition and etching to cover the semiconductor layer as seen in FIG. 2C.

Then an electrode layer 23 is formed on the contact layer 21 by deposition and etching. The electrode layer 23 and the contact layer 21 are further etched to form a channel region so as to separate the contact layer 21 and electrode layer 23 into two separate electrodes as seen in FIG. 2D.

An electrode insulating film 25 is then deposited on the electrode layer 23 and in the channel region located between the two separate electrodes formed by the electrode layer 23. The electrode insulating film 25 is etched to form a contact hole 27 therein as seen in FIG. 2E.

Finally, a transparent electrode such as a pixel electrode 29 is formed by deposition and etching on the electrode insulating film 25 and to fill the hole 27 in the electrode insulating film 25 such that the pixel electrode 29 is electrically connected to one of the two electrodes (source and drain) formed by the electrode layer 23.

The clad structure of the gate electrode formed by the first metal layer 13 and the second metal layer 15 experiences many problems. With the clad structure shown in FIGS. 2A–2F, hillock may be formed on either side of the single step difference between the gate electrode and substrate. In addition, the step coverage of later formed layers is decreased and the source and drain regions formed on the gate oxide layer may have disconnections between areas of the source and drain regions which are overlapped and non-overlapped with the gate or electrically exhibit short circuits as a result of contact with the gate.

In another conventional thin-film transistor shown in FIG. 3, a substrate 31 has an inner gate electrode 34 includes a first metal layer 34a consisting of Al and a second metal layer 34b consisting of a Mo layer. The first and second metal layers 34a, 34b are formed such that there is only a single step difference between the gate electrode 34 and the substrate 31 as a result of the first and second metal layers 34a, 34b having substantially the same width.

An outer gate electrode 35 is formed on the inner gate electrode 34 so as to completely cover the first and second metal layers 34a, 34b. The outer gate electrode 35 and the inner gate electrode 34 form a gate electrode 32.

The gate electrode 32 is covered by a first gate insulating film 36 to protect the gate electrode 32. Then a second gate insulating film 37 is formed to cover the first gate insulating film 36. The second gate insulating film 37 has a semiconductor layer 38 formed thereon. An insulating layer 39 is formed and etched so as to be located in a channel region between later formed source and drain electrodes consisting of a contact layer 40 and an electrode layer 41. The contact layer 40 and the electrode layer 41 are etched to form a source electrode 42 and a drain electrode 43. A pixel electrode 44 is formed on the same surface as the source and drain electrodes 42, 43 and is electrically connected to the drain electrode 43.

Similar to the conventional device shown in FIGS. 1 and 2A–2F, the conventional thin-film transistor shown in FIG. 3 has a single step difference between the gate electrode 34 and the substrate 31 and experiences many of the same problems including hillock on both sides of the first metal layer 34a. To avoid the problem of hillock at both sides of the first metal layer 34a also experienced by the device shown in FIGS. 1–2F, the device of FIG. 3 must use a double-layered inner gate electrode 34, an outer gate electrode 35 and an oxidation film 36. Without the outer gate electrode 35 and the oxidation film 36, this structure would be similar to the structure shown in FIGS. 1–2F and experience all of the same problems experienced by the device of FIGS. 1–2F as described above.

Although such a structure shown in FIG. 3 may avoid the problem of hillock, it requires far more process steps and layers and increases the time and cost of manufacturing a thin-film transistor.

According to another method of forming the gate, each of the metal layers of Al and Mo form a double step difference with the substrate so as to improve the step coverage of the gate oxide layer.

An example of this method of forming a double metal layer gate structure is described in "Low Cost, High Quality TFT-LCD Process", SOCIETY FOR INFORMATION DISPLAY EURO DISPLAY 96, Proceedings of the 16th International Display Research Conference, Birmingham, England, Oct. 1, 1996, pages 591–594. On page 592 of this publication, a method of forming a double metal gate structure includes the process of depositing two metal layers first and then patterning the two metal layers to thereby eliminate an additional photoresist step. The first metal layer consists of an Al alloy and the second layer consists of Cr.

However, with this method, process difficulties during the one step photoresist process for forming the double metal layer gate resulted in the top layer being wider than the bottom layer causing an overhang condition in which the top layer overhangs the bottom layer. This difficulty may result in poor step coverage and disconnection. This problem was solved by using a three-step etching process in which the photoresist had to be baked before each of the three etching steps to avoid lift-off or removal of the photoresist during etching. This three-step etching process and required baking of the photoresist significantly increases the complexity and steps of the gate forming method.

These and other elements, features, and advantages of the preferred embodiments of the present invention will be apparent from the following detailed description of the preferred embodiments of the present invention, as illustrated in the accompanying drawings.

SUMMARY OF THE INVENTION

To overcome the problems discussed above, the preferred embodiments of the present invention provide a thin-film transistor which overcomes the problems of the prior art devices described above.

More specifically, the preferred embodiments of the present invention, provide a thin-film transistor which prevents a hillock and deterioration of step coverage of a later formed gate oxide layer on a double metal layer gate.

The preferred embodiments of the present invention also provide a method of fabricating a thin-film transistor that avoids the problems of the prior art and simplifies the process for forming a double metal layer gate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as, the appended drawings.

To achieve these and other advantages and in accordance with the purpose of the preferred embodiments of the present invention, as embodied and broadly described, a thin-film transistor preferably comprises a substrate, and a gate including a double-layered structure of first and second metal layers disposed on the substrate, the first metal layer comprising a material which exhibits a tensile stress and the second metal layer which exhibits a compressive stress, the first metal layer being wider than the second metal layer so as to form a double step difference between the gate electrode and the substrate.

In a further preferred embodiment, the first metal layer comprises Al and the second metal layer comprises Mo.

In other preferred embodiments, the second metal layer may comprise a Mo alloy, MoW, MoTa, MoNb or other suitable material.

According to another preferred embodiment of the present invention, a thin-film transistor comprises a substrate, and a gate including a double-layered structure of first and second metal layers disposed on the substrate, the first metal layer comprising a material exhibiting tensile stress and the second metal layer comprising material exhibiting compressive stress, the first metal layer being wider than the second metal layer by about 1 to 4 $\mu$m.

According to yet another preferred embodiment of the present invention, a method of making such a thin-film transistor preferably comprises the steps of: depositing a first metal layer comprising a material exhibiting tensile stress on a substrate, depositing a second metal layer exhibiting compressive stress on the first metal layer; patterning the second metal layer and the first metal layer such that the first metal layer is wider than the second metal layer.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

The accompanying drawings, which are included to provide a further understanding of the invention and are incorporated in and constitute a part of this specification, illustrate preferred embodiments of the invention and together with the description serve to explain the principles of the invention, in which.

DETAILED DESCRIPTION OF PREFERRED EMBODIMENTS

Reference will now be made in detail to preferred embodiments of the present invention, examples of which are illustrated in the accompanying drawings.

Figure 1:
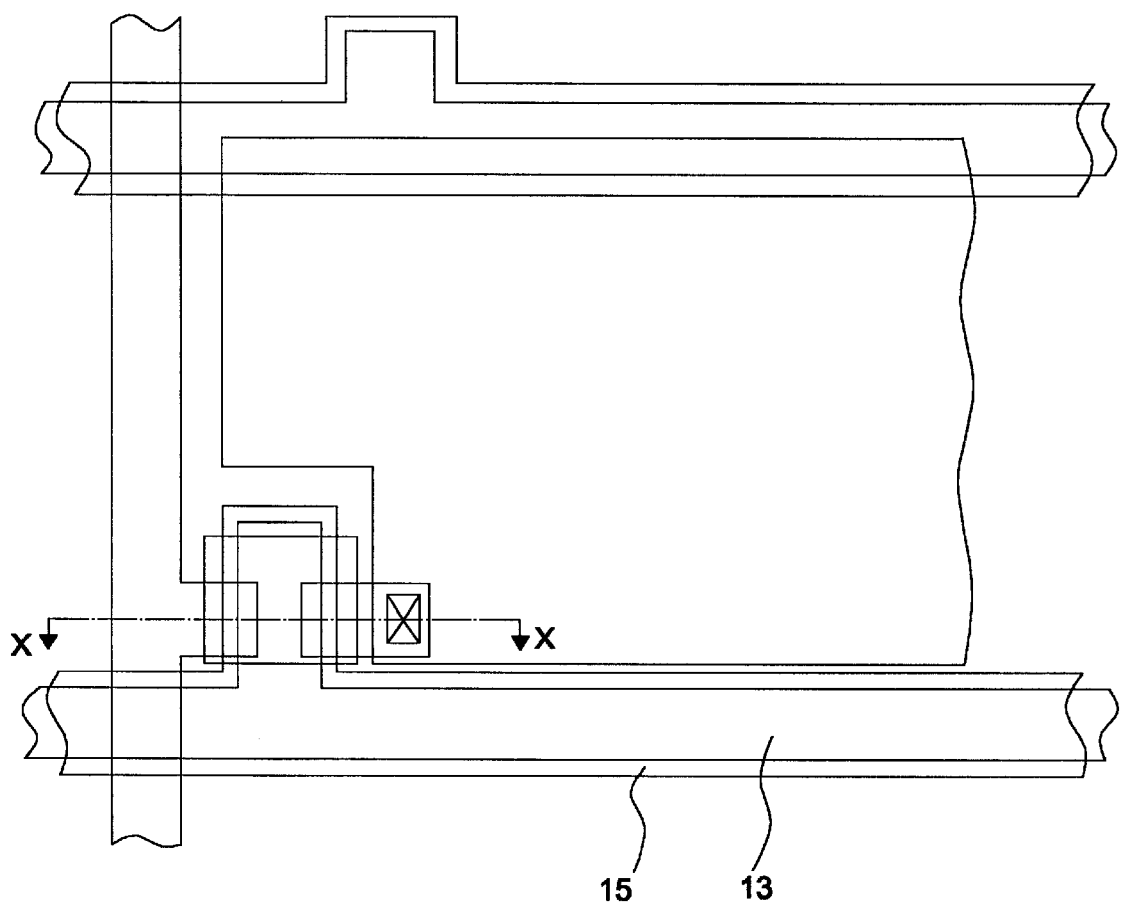
FIG. 1 is a top plan view of a prior art thin-film transistor.
Figure 2A:
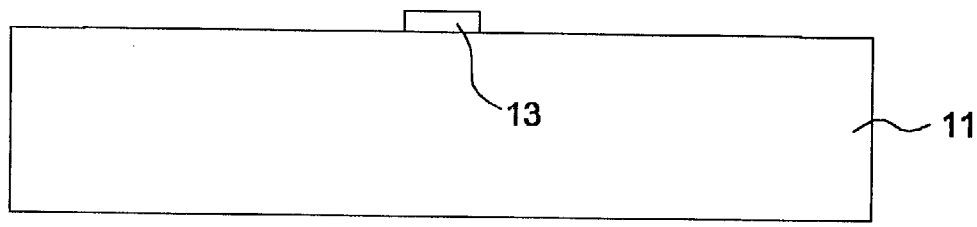
FIGS. 2A–2F are cross-sectional views of FIG. 1 along line X—X.
Figure 2B:
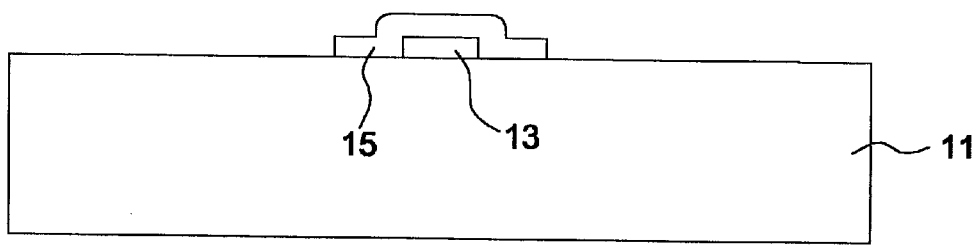
Figure 2C:
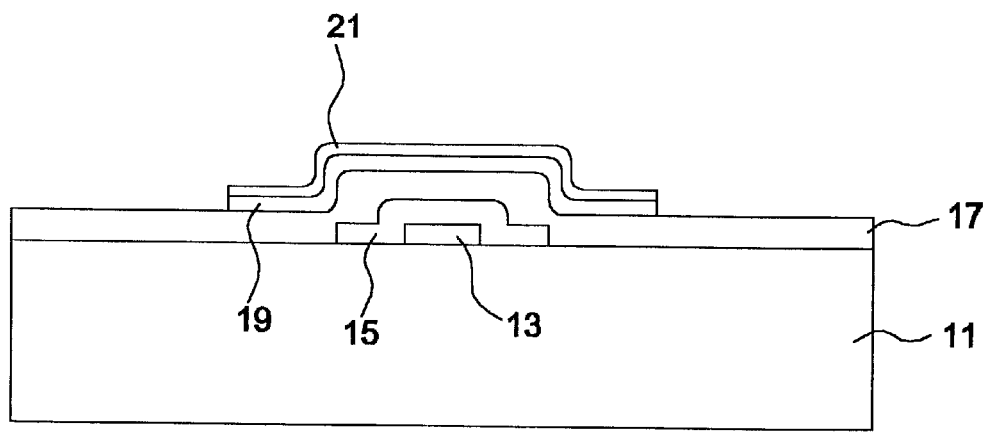
Figure 2D:
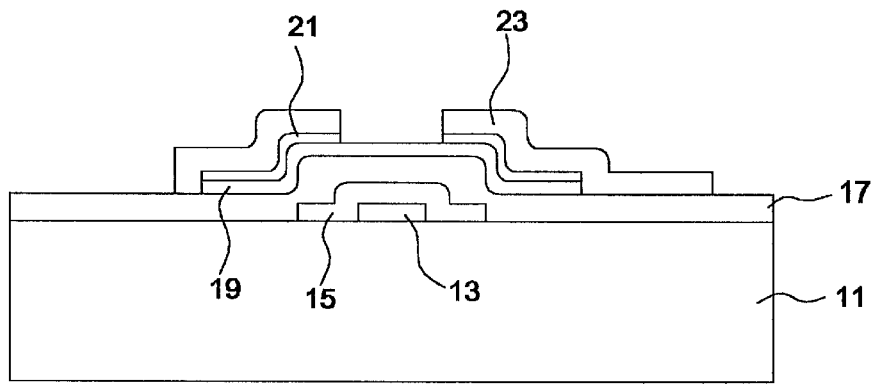
Figure 2E:
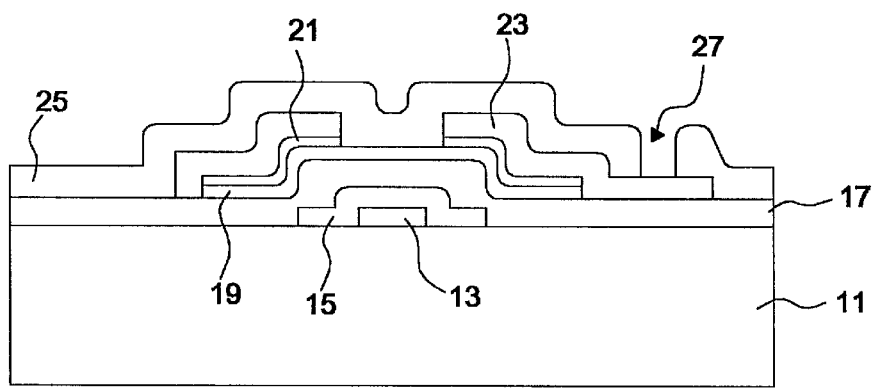
Figure 2F:
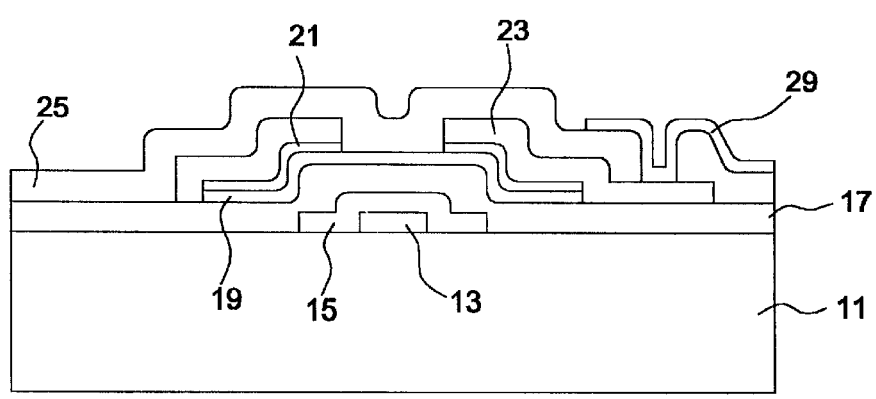
Figure 3:
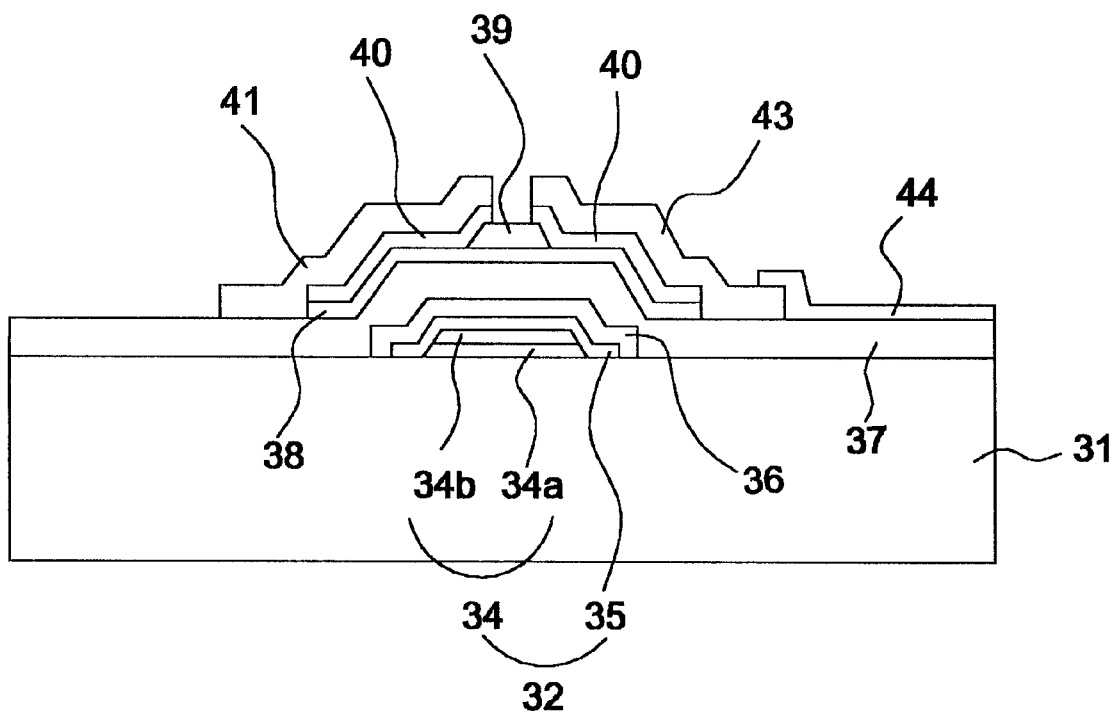
FIG. 3 is a cross-sectional view of another prior art thin-film transistor.
Figure 4:
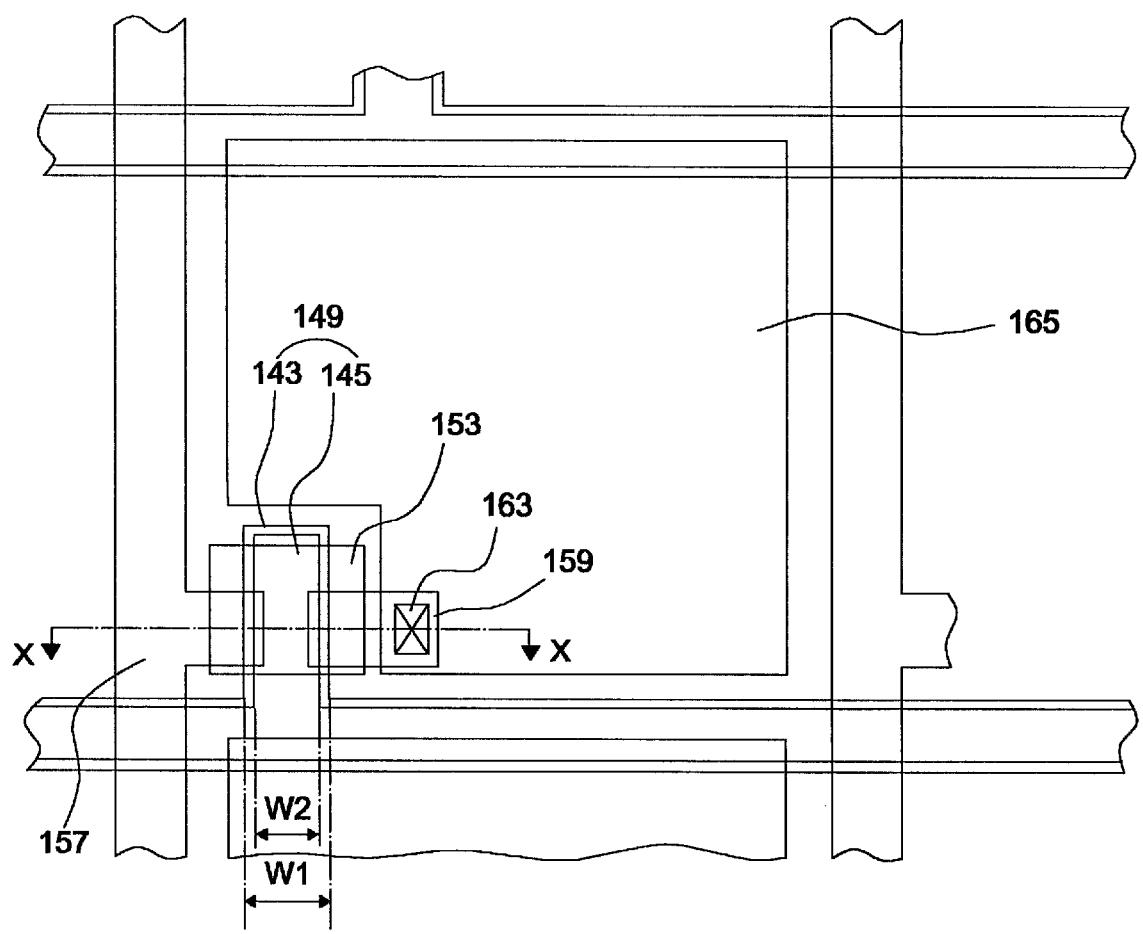
FIG. 4 is a top plan view of a thin-film transistor according to a preferred embodiment of the present invention.

FIG. 4 is a top plan view of a thin-film transistor according to a preferred embodiment of the present invention.

FIGS. 5A through 5F are diagrams illustrating a process for fabricating a thin-film transistor according to one preferred embodiment of the present invention in which one masking step and two etching steps are used.

Figure 5A:
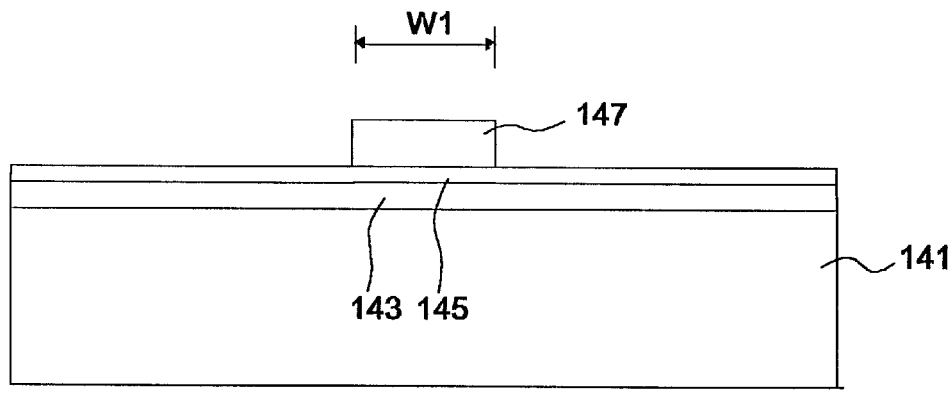
FIGS. 5A through 5F are diagrams illustrating a process for fabricating a thin-film transistor according to one preferred embodiment of the present invention in which one masking step and two etching steps are used.
Figure 5B:
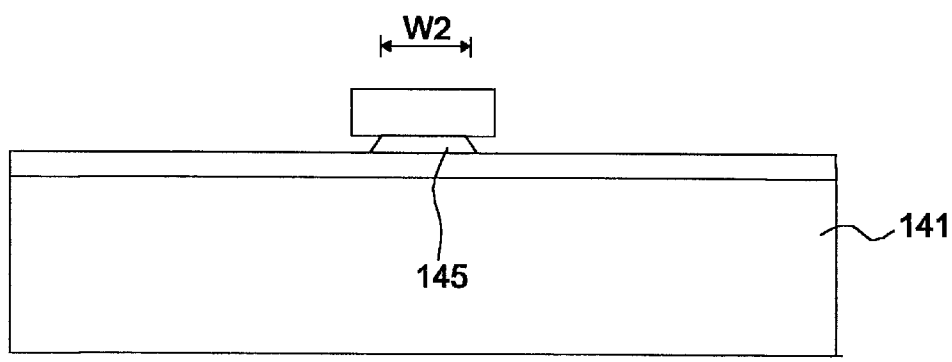
Figure 5C:
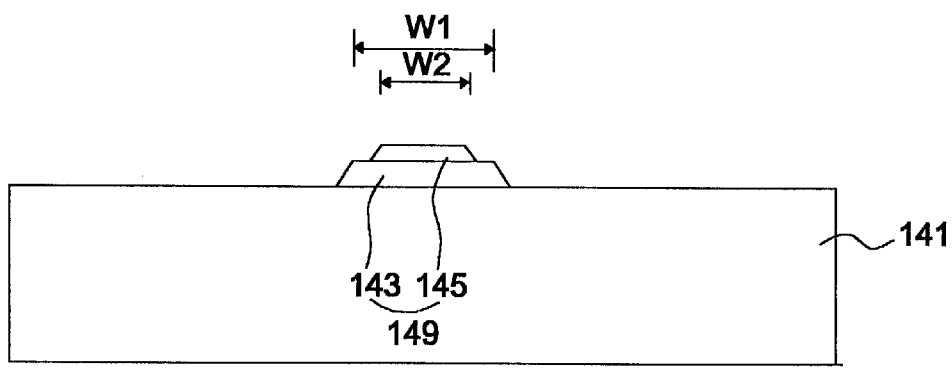
Figure 5D:
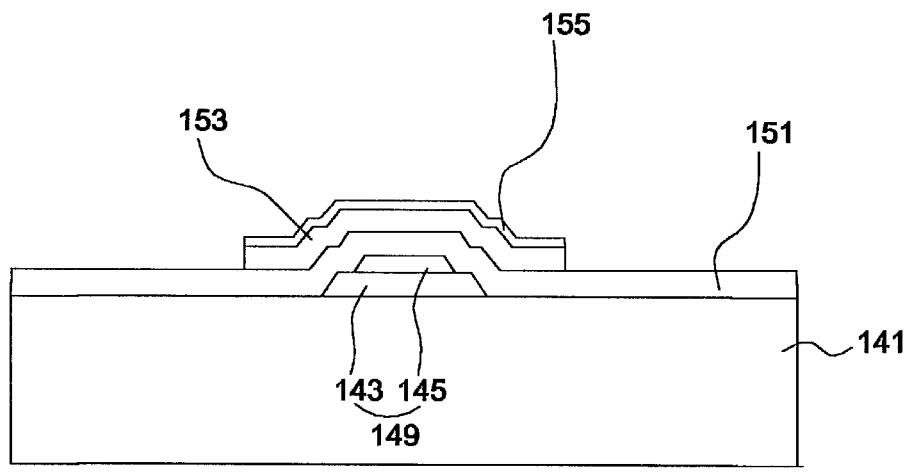
Figure 5E:
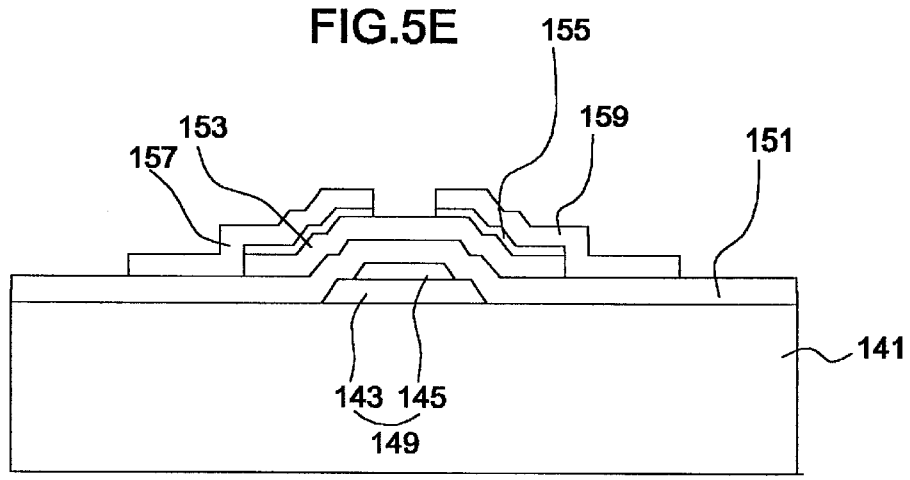
Figure 5F:
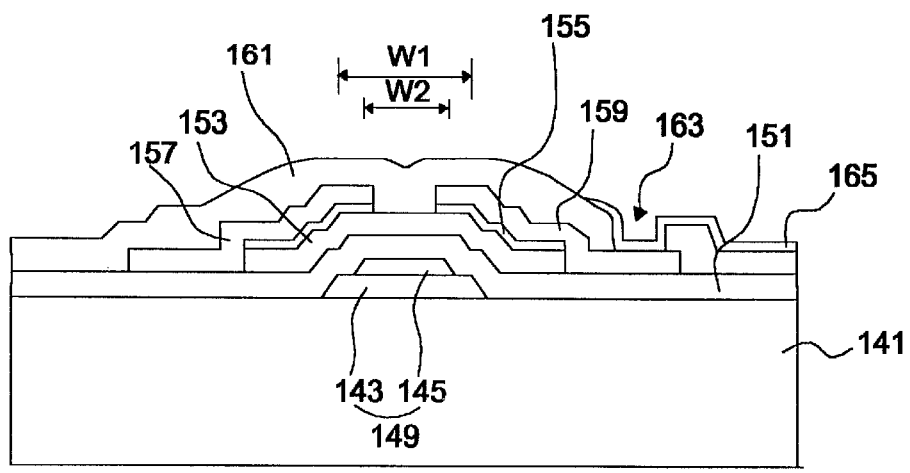
Figure 6A:
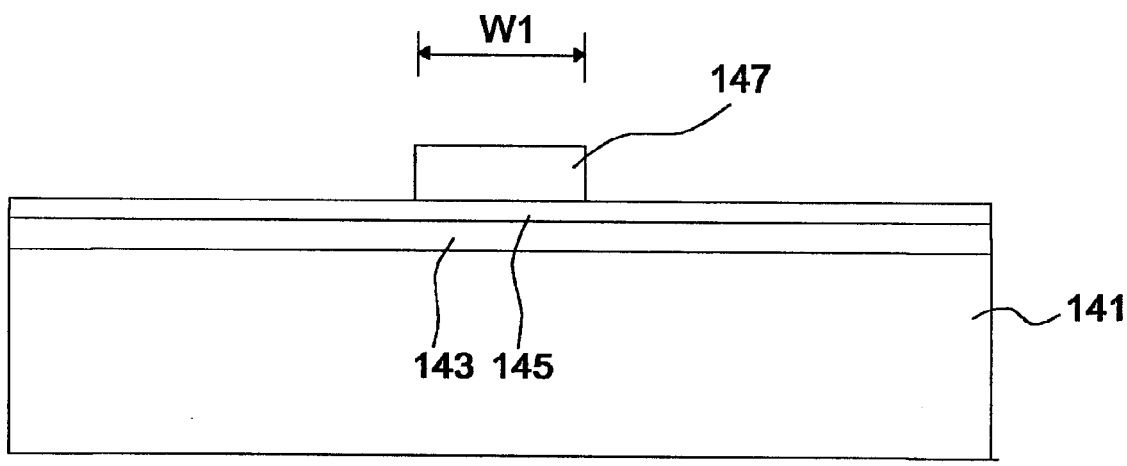
FIGS. 6A through 6E are diagrams illustrating a process for fabricating a thin-film transistor according to one preferred embodiment of the present invention in which one masking step and one etching steps are used.
Figure 6B:
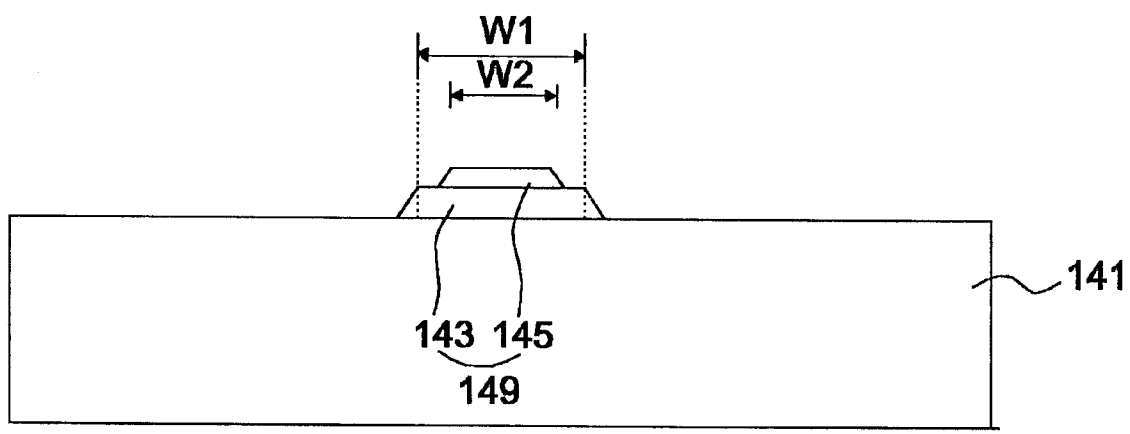
Figure 6C:
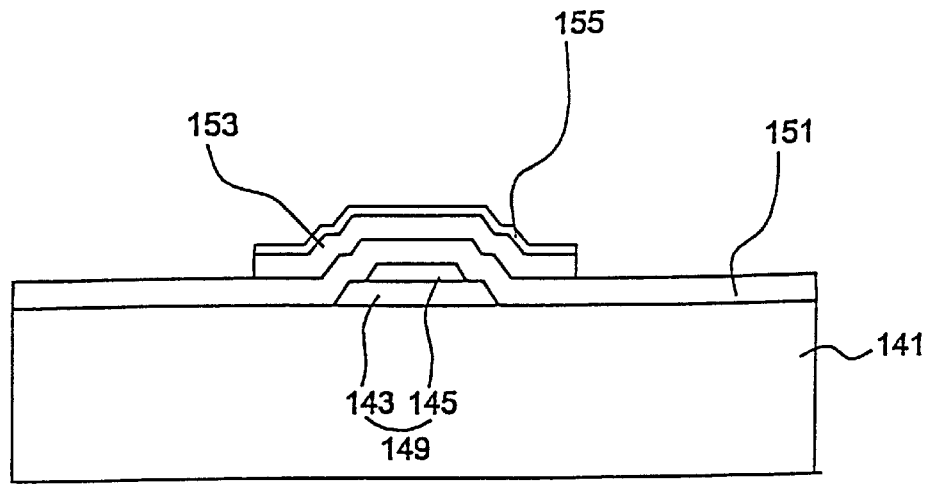
Figure 6D:
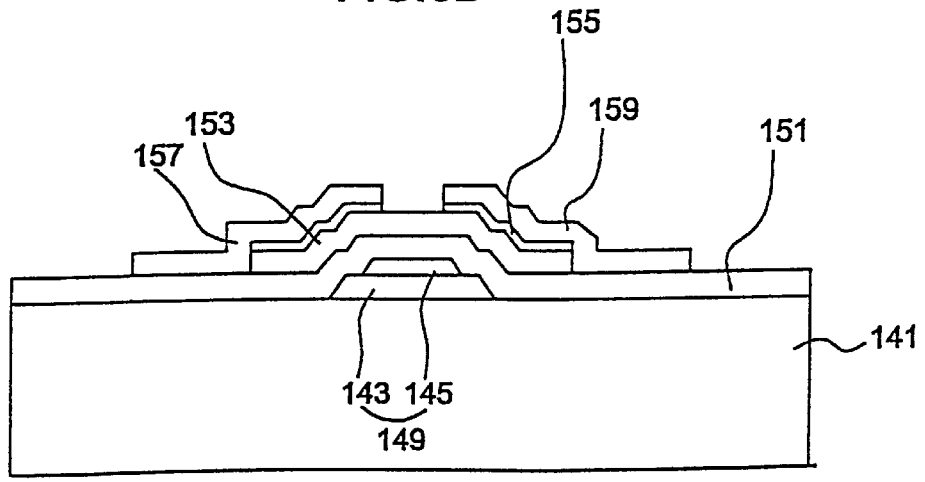
Figure 6E:
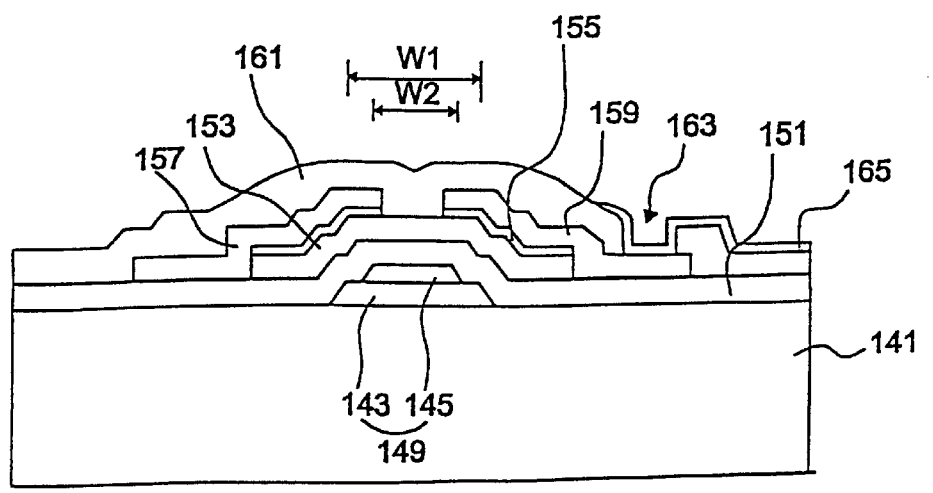

The thin-film transistor as seen in FIG. 5F comprises a gate 149 having a double-layered structure of a first metal layer 143, a second metal layer 145 disposed on a substrate 141, a first insulating layer 151, a second insulating layer 161, a semiconductor layer 153, an ohmic contact layer 155, a source electrode 157, a drain electrode 159, and a pixel electrode 165.

The gate 149 has a double-layered structure including the first and second metal layers 143 and 145 disposed on the substrate 141. The first metal layer 143 is preferably formed a from a conductive metal which exhibits tensile stress such as Al, Cu, or Au deposited to have a certain width w1. The second metal layer 145 is preferably formed from a metal which exhibits a compressive stress such as Mo, a Mo alloy, MoW, MoTa, MoNb, etc. and is deposited to have a certain width w2.

The present inventors have discovered that when the first conductive metal layer 143 having a tensile stress is used in combination with a second metal layer 145 having a compressive stress, the reaction between the tensile stress metal layer 143 and the compressive stress metal layer 145 causes a hillock condition to be prevented. More specifically, the compressive stress of the second metal layer 145 minimizes the effect of the tensile stress of the first metal layer 143 so as to reduce and prevent hillock which may form between the first metal layer 143 and the substrate 141.

The present inventors have further discovered that the reaction between the compressive stress layer 145 and the tensile stress layer 143 is most effective in preventing hillock when a newly discovered relationship between the width of the first metal layer and the width of the second metal layer of the double metal layer gate electrode is used. The reaction between the compressive stress second metal layer and the tensile stress first metal layer and the relationship between the widths of the first and second metal layers is critical to preventing hillock and deterioration of step coverage of a later formed gate oxide layer in such a structure having a double step difference between the substrate and the gate. More specifically, the present inventors determined that a structure wherein the first metal layer 143 is formed of a material exhibiting tensile stress and is wider than the second metal layer 145 formed of a material exhibiting compressive stress by about 1 to 4 $\mu$m, for example, 1 $\mu$m<w1−w2<4 $\mu$m, provides maximum prevention of deterioration of step coverage of a later formed gate oxide layer in such a structure having a double step difference between the substrate and the gate.

To achieve the best results, the second metal layer 145 is preferably positioned substantially in the middle of the first metal layer 143, so that both side portions of the first metal layer 143 which have no portion of the second metal layer 145 disposed thereon have substantially the same width as each other. The width of each of the side portions is preferably larger than about 0.5 $\mu$m but less than about 2 $\mu$m.

The first insulating layer 151 is preferably formed by depositing single layer of silicon oxide $SiO_2$ or silicon nitride $Si_3N_4$ on the substrate including the gate 149.

The semiconductor and ohmic contact layers 153 and 155 are formed on the portion of the first insulating layer 151 corresponding to the gate 149 by sequentially depositing undoped amorphous silicon and heavily doped amorphous silicon and patterning the two silicon layers. The semiconductor layer 153 is used as the active region of an element, thus forming a channel by means of a voltage applied to the gate 149. The ohmic contact layer 155 provides an ohmic contact between the semiconductor layer 153 and the source and drain electrodes 157 and 159. The ohmic contact layer 155 is not formed in the portion that becomes the channel of the semiconductor layer 153.

The source and drain electrodes 157 and 159 are in contact with the ohmic contact layer 155, and each electrode 157, 159 extends to a designated portion on the first insulating layer 151.

The second insulating layer 161 is formed by depositing insulating material such as silicon oxide $SiO_2$ silicon nitride $Si_3N_4$ to cover the source and drain electrodes 157 and 159 and the first insulating layer 151. The second insulating layer 161 on the drain electrode 159 is removed to form a contact hole 163. The pixel electrode 165 is formed from transparent and conductive material such as ITO (Indium Tin Oxide) or Tin oxide $SnO_2$, so that it is connected to the drain electrode 159 through the contact hole 163.

In the first and second metal layers 143 and 145 constituting the gate 149, each side portion of the first metal layer 143 having no portion of the second metal layer 145 thereon has a width that is preferably larger than about 0.5 $\mu$m and less than about 2 $\mu$m. Because the first metal layer 143 is wider than the second metal layer 145 by about 1.0 $\mu$m to 4.0 $\mu$m, double step differences determined according to the relationship between the width of the first metal layer and the width of the second metal layer are formed between the gate 149 and substrate 141. The double step differences determined according to the novel features of the preferred embodiments of the present invention prevent deterioration of the coverage of the first insulating layer 151 which deterioration occurs in prior art devices. The hillock in the first metal layer 143 is also avoidable because the effect of the compressive stress of the second metal layer 145 on the tensile stress of the first metal layer 143 minimizes the effect of the tensile stress of the first metal layer 143 and the width difference between the first and second metal layers 143 and 145 is between about 1 $\mu$m to 4 $\mu$m.

FIGS. 5A through 5F are diagrams illustrating the process for fabricating the thin-film transistor of the preferred embodiments of the present invention.

Referring to FIG. 5A, a metal exhibiting a tensile stress, such as Al, Cu, or Au, is deposited on a substrate 141 so as to form a first metal layer 143. A second metal layer 145 is formed from a material exhibiting compressive stress, such as Mo, a Mo alloy, MoW, MoTa or MoNb, and is deposited on the first metal layer 143 without performing a masking step between the step of depositing the first metal layer and the step of depositing the second metal layer. The first and second metal layers 143 and 145 are sequentially deposited so as to preferably have a thickness as large as about 500–4000 Å and 500–2000 Å, respectively, by means of sputtering or chemical vapor deposition (hereinafter, referred to as CVD) without breaking a vacuum state. As a result, the contact resistance between the first and second metal layers 143 and 145 is reduced.

According to the preferred embodiments of the present invention, a single photoresist step is used to pattern both the first metal layer 143 and the second metal layer 145 simultaneously. In the single photoresist step, a photoresist 147 is deposited on the second metal layer 145 and then the photoresist 147 is patterned through exposure and development to have the width w1 on a designated portion of the second metal layer 145.

Referring to FIG. 5A, the second metal layer 145 is patterned with an etching solution preferably prepared with a mixture of phosphoric acid $H_3PO_4$, acetic acid $CH_3COOH$ and nitric acid $HNO_3$, by means of a wet etching using the photoresist 147 as a mask. Because the portion of the second metal layer 145 covered with the photoresist 147, as well as, exposed side portions of the second metal layer 145 are isotopically etched, the second metal layer 145 is preferably patterned to have the width w2 which is narrower than the width w1 of the photoresist 147 which is the same as the width w1 of the first metal layer 143, that is, about 1 $\mu m<w1-w2<4 \mu m$. Each side portion of the second metal layer 145 preferably has a width larger than about 0.5 $\mu m$ and less than about 2 $\mu m$. That is, the two side portions of the second metal layer 145 covered with the photoresist 147 are preferably etched to have substantially the same width as each other. The lateral surfaces of the second metal layer 145 are preferably etched to have a substantially rectangular or inclined shape.

Referring to FIG. 5B, the first metal layer 143 is patterned via a dry etching having anisotropic etching characteristic such as reactive ion etching (hereinafter, referred to as RIE) by using the photoresist 147 as a mask. When etching the first metal layer 143 other than the portion of the layer 143 covered with the photoresist 147, the first metal layer 143 preferably has the same width w1 of the photoresist 147. Thus, patterning of the first and second metal layers 143, 145, respectively, only requires two etching steps and does not require baking of the photoresist before each step of etching. Also, the relation between the first and second metal layers 143 and 145 also may be represented by about 1 $\mu m<w1-w2<4 \mu m$.

The first and second metal layers 143 and 145 resulting from the single photoresist step process described above form a gate 149 having a double-layered metal structure. The gate 149 has the second metal layer 145 positioned substantially in the middle of the first metal layer 143 so that the each side portion of the first metal layer 143 having no second metal layer 145 thereon is wider than about 0.5 $\mu m$ but narrower than about 2 $\mu m$. The photoresist 147 remaining on the second metal layer 145 is removed after the two etching steps are completed.

Referring to FIG. 5D, a first insulating layer 151 is formed by depositing a single layer or double layers of silicon oxide $SiO_2$ or silicon nitride $Si_3N_4$ on the gate 149 and substrate 141 by CVD. Because each side portion of the first metal layer 143 having no second metal layer 145 thereon is wider than about 0.5 $\mu m$, double step differences formed between the substrate and gate can prevent the coverage of the first insulating layer 151 from being deteriorated as in prior art devices. The hillock in the first metal layer 143 is also avoidable because of the effect of the compressive stress of second metal layer 145 on the tensile stress exhibited by the first metal layer 143 and because a width of a portion of the first metal layer 143 which is exposed and not covered by the second metal layer 145 is less than about 2 $\mu m$.

Amorphous silicon which is undoped and heavily doped amorphous silicon are sequentially deposited on the first insulating layer 151 by CVD, thus forming semiconductor and ohmic contact layers 153 and 155. The ohmic contact and semiconductor layers 155 and 153 are patterned by means of photolithography to expose the first insulating layer 151.

Referring to FIG. 5E, conductive metal such as Al or Cr is laminated on the insulating and ohmic contact layers 151 and 155 and patterned by photolithography to form source and drain electrodes 157 and 159. The ohmic contact layer 155 exposed between the source and drain electrodes 157 and 159 is etched by using the source drain electrodes 157 and 159 as masks.

Referring to FIG. 5F, a second insulating layer 161 is formed by depositing insulating material such as silicon oxide or silicon nitride by CVD on the entire surface of the above structure. The second insulating layer is removed by photolithography to expose a designated portion of the drain electrode 159 and thus form a contact hole 163. Once transparent and conductive material such as ITO (Indium Tin Oxide)or Tin oxide $SnO_2$ is deposited on the second insulating layer 161 via sputtering and patterned by photolithography, a pixel electrode 165 is formed so that it is electrically connected to the drain electrode 159 through the contact hole 163.

In another preferred embodiment of the present invention, the first and second metal layers 143 and 145 are first etched by means of a dry etching having anisotropic etching characteristic such as RIE by using the photoresist 147 as a mask. The gate 149 is formed by etching the second metal layer 145 under the photoresist 147 with an etching solution prepared with a mixture of phosphoric acid $H_3PO_4$, acetic acid $CH_3COOH$ and nitric acid $HNO_3$.

In still another preferred embodiment of the present invention shown in FIGS. 6A–6E, the gate 149 is formed through a single etching step process for etching the first and second metal layers 143 and 145 simultaneously and via a single etching step, where the second metal layer 145 is etched more quickly than the first metal layer 143 with an etching solution prepared with a mixture of phosphoric acid $H_3PO_4$, acetic acid $CH_3COOH$ and nitric acid $HNO_3$. Because of the etching material and metals used for the first and second metal layers of the gate, only a single etching step is required. Despite the fact that a single etching step is used, it is still possible to obtain the relationship between the widths w1 and w2 of the first and second metal layers described above. In this process, the first and second metal layers forming the gate 149 are formed and patterned with a single photo resist step as described above and a single etching step.

As described above, in the preferred embodiments of the present invention, a first metal layer exhibiting tensile stress and a second metal layer exhibiting compressive stress are sequentially deposited on the substrate without performing a masking step between the step of depositing the first metal layer and the second metal layer, followed by forming a photoresist that covers a designated portion of the second metal layer. In one preferred embodiment, the second metal layer is wet etched by using the photoresist as a mask but the first metal layer is dry etched. As a result, the double-metal gate is formed. In another preferred embodiment, a single etching step is used to form the double-metal gate wherein both the first metal layer and the second metal layer are wet etched, but the different in etching rates of the first and second metal layers produces different etching affects which result in the desired double-step structure.

While the invention has been particularly shown and described with reference to preferred embodiments thereof, it will be understood by those skilled in the art that the foregoing and other changes in form and details may be made therein without departing from the spirit and scope of the invention.

What is claimed is:
1. A thin film transistor comprising:
  a substrate; and
  a gate including a double-layered structure having a first metal layer formed of a material including aluminum that exhibits a tensile stress and a second metal layer formed of a material exhibiting a compressive stress disposed on the substrate, wherein the tensile stress of the first metal layer and the compressive stress of the second metal layer combine to prevent a hillock from occurring at the gate;

wherein the first metal layer is wider than the second metal layer by about 1 to 4 µm.

2. The thin-film transistor as claimed in claim 1, wherein the second metal layer is located in a middle portion of the first metal layer so that two side portions of the first metal layer having no second metal layer disposed thereon have the same width as each other.

3. The thin-film transistor as claimed in claim 1, wherein the second metal layer includes at least one of Mo, a Mo alloy, MoW, MoTa and MoNb.

4. A thin film transistor comprising:

a substrate; and a gate including a double-layered structure having a first metal layer and a second metal layer disposed on the substrate, the first metal layer being formed of a material including aluminum that exhibits tensile stress and a second metal layer being formed of a material exhibiting compressive stress, the tensile stress of the first metal layer and the compressive stress of the second metal layer being such that the combination of the tensile stress and the compressive stress prevents a hillock from occurring at the gate;

wherein the first metal layer is wider than the second metal layer by about 1 to 4 µm.

5. The thin-film transistor as claimed in claim 4, wherein the second metal layer is located in a middle portion of the first metal layer so that two side portions of the first metal layer having no second metal layer thereon have the same width as each other.

6. The thin-film transistor as claimed in claim 4, wherein the second metal layer includes at least one of Mo, a Mo alloy, MoW, MoTa and MoNb.

7. The thin film transistor according to claim 1, wherein the first metal layer is Al and the second metal layer is Mo.

8. The thin film transistor according to claim 7, wherein the Mo has compressive stress.

9. The thin film transistor according to claim 1, further comprising a source electrode and a drain electrode provided on the gate insulating layer.

10. The thin film transistor according to claim 9, further comprising a passivation layer disposed on the source and drain electrodes.

11. The thin film transistor according to claim 9, further comprising a source/drain pad connected to one of the source and drain electrodes provided on the gate insulating layer.

12. The thin film transistor according to claim 11, further comprising a passivation layer disposed on the source and drain electrodes, and a pixel electrode disposed in contact with the source/drain pad via a contact hole formed in the passivation layer.

13. The thin film transistor according to claim 1, wherein the first metal layer has a thickness of about 500 to about 4,000 angstroms.

14. The thin film transistor according to claim 1, wherein the second metal layer has a thickness of about 500 to about 2,000 angstroms.

15. The thin film transistor according to claim 1, wherein the first metal layer has a thickness of about 1,500 to about 2,500 angstroms.

16. The thin film transistor according to claim 1, wherein the second metal layer has a thickness of about 500 to about 1,000 angstroms.

17. The thin film transistor according to claim 4, wherein the first metal layer is Al and the second metal layer is Mo.

18. The thin film transistor according to claim 17, wherein the Mo has compressive stress.

19. The thin film transistor according to claim 4, wherein the first metal layer has a thickness of about 500 to about 4,000 angstroms.

20. The thin film transistor according to claim 4, wherein the second metal layer has a thickness of about 500 to about 2,000 angstroms.

21. The thin film transistor according to claim 4, wherein the first metal layer has a thickness of about 1,500 to about 2,500 angstroms.

22. The thin film transistor according to claim 4, wherein the second metal layer has a thickness of about 500 to about 1,000 angstroms.

23. The thin film transistor according to claim 1, wherein the first metal layer is wider than the second metal layer.

24. The thin film transistor according to claim 1, wherein the tensile stress of the first metal layer is equal to the compressive stress of the second metal layer.

25. The thin film transistor according to claim 4, wherein the first metal layer is wider than the second metal layer.

26. The thin film transistor according to claim 1, wherein the tensile stress of the first metal layer is equal to the compressive stress of the second metal layer.

27. The thin film transistor of claim 1 further comprising a gate insulating layer disposed to cover and directly contact said gate without any other layers being disposed between said gate and said gate insulating layer.

28. The thin film transistor of claim 4 further comprising a first insulating layer disposed on the substrate including the gate and arranged to cover and directly contact said agate without any other layers being disposed between said agate and said first insulating layer.

29. The thin film transistor of claim 4 further comprising a semiconductor layer disposed on a portion of the insulating layer at a location corresponding to the gate.

30. The thin film transistor of claim 4 further comprising an ohmic contact layer disposed on two sides of the semiconductor layer; a source electrode and a drain electrode disposed on the ohmic contact layer and extending onto the first insulating layer.

31. The thin film transistor of claim 4 further comprising a second insulating layer covering the semiconductor layer, the source and drain electrodes and the first insulting layer.

* * * * *